(12) United States Patent
Monden et al.

(10) Patent No.: US 11,693,060 B2
(45) Date of Patent: Jul. 4, 2023

(54) BATTERY MONITORING DEVICE AND METHOD

(71) Applicants: Kabushiki Kaisha Toshiba, Minato-ku (JP); Toshiba Energy Systems & Solutions Corporation, Kawasaki (JP)

(72) Inventors: Yukitaka Monden, Kawasaki (JP); Takenori Kobayashi, Meguro (JP)

(73) Assignees: Kabushiki Kaisha Toshiba, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 16/082,792

(22) PCT Filed: Mar. 8, 2016

(86) PCT No.: PCT/JP2016/057198
§ 371 (c)(1),
(2) Date: Sep. 6, 2018

(87) PCT Pub. No.: WO2017/154112
PCT Pub. Date: Sep. 14, 2017

(65) Prior Publication Data
US 2019/0081369 A1 Mar. 14, 2019

(51) Int. Cl.
G01R 31/389 (2019.01)
G01R 31/3832 (2019.01)
(Continued)

(52) U.S. Cl.
CPC ....... G01R 31/389 (2019.01); G01R 31/3832 (2019.01); G01R 31/392 (2019.01);
(Continued)

(58) Field of Classification Search
CPC .... H01M 10/482; H01M 10/44; H01M 10/48; H01M 10/486; G01R 31/389;
(Continued)

(56) References Cited

U.S. PATENT DOCUMENTS 6,072,300 A * 6/2000 Tsuji .................... G01R 31/396
324/429
2007/0052424 A1 3/2007 Okumura
(Continued)

FOREIGN PATENT DOCUMENTS

CN 104614630 A 5/2015
CN 104614630 B * 11/2017
(Continued)

OTHER PUBLICATIONS

JP-2004031123-A translation (Year: 2004).*
(Continued)

*Primary Examiner* — Ula C Ruddock
*Assistant Examiner* — Amanda Rosenbaum
(74) *Attorney, Agent, or Firm* — Oblon, McClelland, Maier & Neustadt, L.L.P.

(57) ABSTRACT

A battery monitoring device according to an embodiment monitors a state of a secondary battery block including parallel cell blocks connected in series each of which includes battery cells connected in parallel. A calculator calculates direct-current internal resistance values of the parallel cell blocks based on a differential current between first and second current values detected by a current detector, voltages of the parallel cell blocks corresponding to the first and second current values detected by a voltage detector. A determiner performs anomaly determination for the parallel cell blocks from the direct-current internal resistance values of the parallel cell blocks and a maximum value of the direct-current internal resistance values of the parallel cell blocks.

12 Claims, 14 Drawing Sheets

(51) Int. Cl.
*G01R 31/392* (2019.01)
*H01M 10/42* (2006.01)
*H01M 10/48* (2006.01)
*H02J 7/04* (2006.01)
*G01R 31/3842* (2019.01)
*H02J 7/00* (2006.01)
*H02J 7/02* (2016.01)
*G01R 31/396* (2019.01)

(52) U.S. Cl.
CPC ......... *H01M 10/42* (2013.01); *H01M 10/425* (2013.01); *H01M 10/48* (2013.01); *H01M 10/482* (2013.01); *H01M 10/486* (2013.01); *H02J 7/00* (2013.01); *H02J 7/02* (2013.01); *H02J 7/04* (2013.01); *G01R 31/3842* (2019.01); *G01R 31/396* (2019.01); *H01M 2010/4271* (2013.01)

(58) Field of Classification Search
CPC .............. G01R 31/3832; G01R 31/392; G01R 31/396; G01R 31/3842
See application file for complete search history.

(56) References Cited

U.S. PATENT DOCUMENTS

2007/0200567 A1* 8/2007 Mizuno .............. G01R 31/3648 324/430

2014/0349150 A1 11/2014 Matsuyama et al.
2015/0263395 A1 9/2015 Okabe et al.

FOREIGN PATENT DOCUMENTS

| | | | |
|---|---|---|---|
| JP | 2000-182662 A | | 6/2000 |
| JP | 2004-31123 A | | 1/2004 |
| JP | 2004031123 A | * | 1/2004 |
| JP | 2006-138750 A | | 6/2006 |
| JP | 2006138750 A | * | 6/2006 |
| JP | 4606846 B2 | | 1/2011 |
| JP | 2013-137867 A | | 7/2013 |
| JP | 2013-146177 A | | 7/2013 |
| JP | 2014-23362 A | | 2/2014 |
| JP | 2014-41 747 A | | 3/2014 |
| JP | 2014-75317 A | | 4/2014 |
| JP | 2014-110198 A | | 6/2014 |
| JP | 2014-119397 A | | 6/2014 |
| JP | 2014-127404 A | | 7/2014 |
| JP | 2015-8040 A | | 1/2015 |

OTHER PUBLICATIONS

CN-104614630-B (Year: 2015).*
International Search Report dated May 24, 2016 in PCT/JP2016/057198 filed Mar. 8, 2016.
Extended European Search Report dated Oct. 8, 2019 in Patent Application No. 16893444.6, 9 pages.

* cited by examiner

BATTERY MONITORING DEVICE AND METHOD

FIELD

An embodiment described herein relates generally to a battery monitoring device and a method.

BACKGROUND

In recent years, the use of safe and clean natural energy including solar power generation and wind power generation has been growing. However, the output of natural energy is unstable, so that a large scale of introduction of natural energy may adversely affect the voltage or frequency of the power grid. If the supply of natural energy greatly exceeds power demand, natural-energy power generation systems need to be stopped, lowering the use rate of power generation facilities.

Conventionally, to stabilize the voltage and frequency of the power grid, a governor-free control and a load frequency control (LFC) function of generators, and load leveling by pumped-storage power generation have been implemented. However, issues arise such as an insufficient lower margin of generators, restrictions on construction site of a pumped storage power plant, and a long construction period.

In view of this, stationary large-scale storage battery systems including secondary batteries and relatively less restricted by the conditions of site are increasingly attracting attention.

Such a large-scale storage battery system is known, including a battery pack which incorporates secondary battery blocks in which parallel cell blocks of parallel-connected battery cells are connected in series.

DETAILED DESCRIPTION

In general, a battery monitoring device that monitors a state of a secondary battery block including a plurality of parallel cell blocks connected in series, the parallel cell blocks each including a plurality of battery cells connected in parallel. The battery monitoring device according an embodiment includes a current detector, a voltage detector, a calculator, and a determiner. The current detector that detects current flowing through each of the parallel cell blocks. The voltage detector that detects voltage of each of the parallel cell blocks when the current flowing through the parallel cell block is a first current value, and when the current flowing through the parallel cell block is a second current value. The calculator that calculates a direct-current internal resistance value of each of the parallel cell blocks on the basis of a differential current between the first current value and the second current value, the voltage of the parallel cell block at the first current value, and the voltage of the parallel cell block at the second current value. The determiner that performs anomaly determination for the parallel cell blocks on the basis of direct-current internal resistance values of the parallel cell blocks and a maximum value of the direct-current internal resistance values of the parallel cell blocks.

Hereinafter, embodiments will be described in detail with reference to the accompanying drawings.

Figure 1:
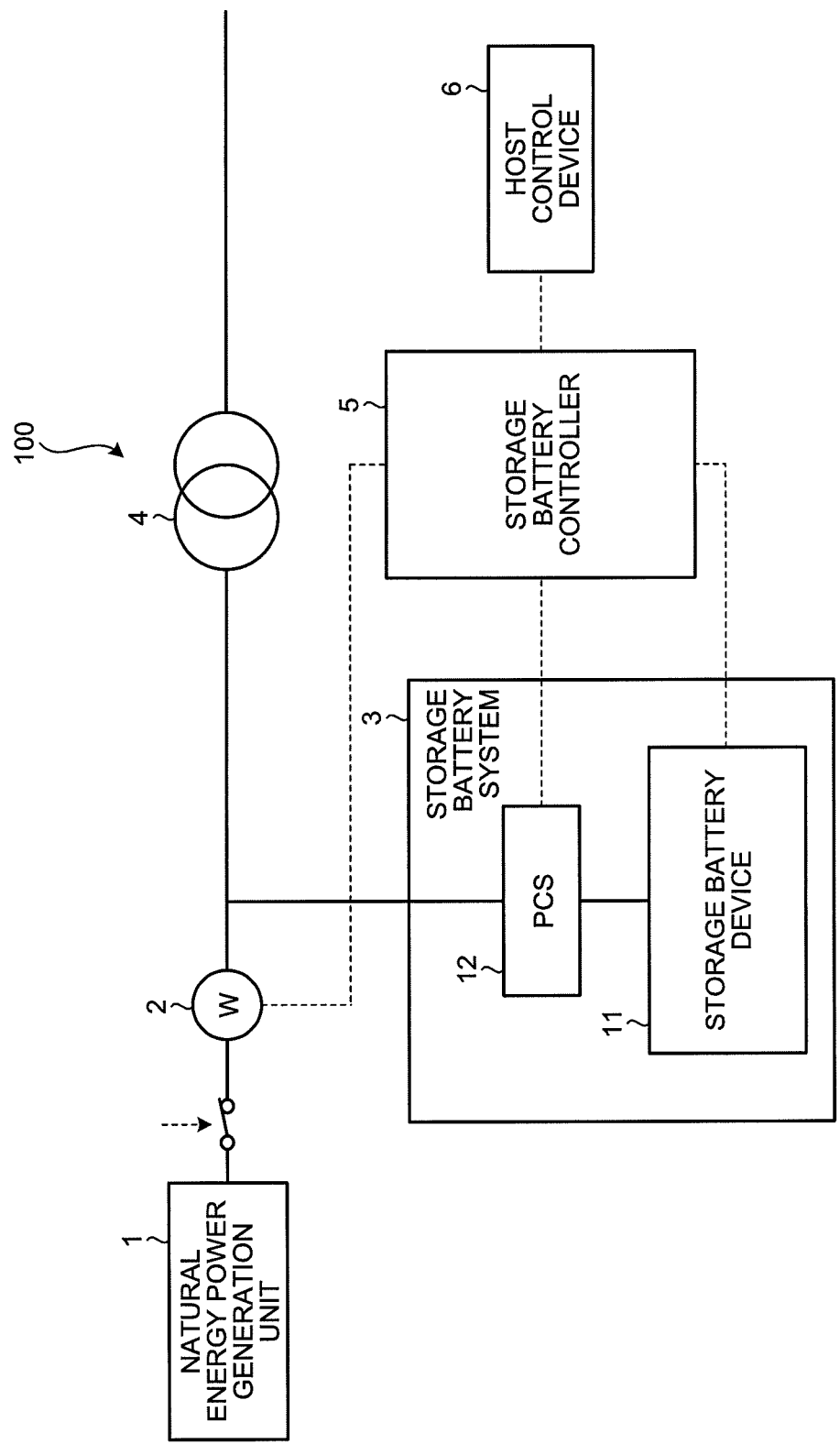
FIG. 1 is a schematic configuration diagram of a natural-energy power generation system including a storage battery system according to an embodiment.

FIG. 1 is a schematic configuration diagram of a natural-energy power generation system including a storage battery system according to an embodiment.

A natural-energy power generation system 100 functions as a power system and includes a natural-energy power generation unit 1, a power meter 2, a storage battery system 3, a transformer 4, a storage battery controller 5, and a host control device 6. The natural-energy power generation unit 1 can output system power, using natural energy such as solar light, hydraulic-power, wind power, biomass, and geothermal energy (renewable power). The power meter 2 measures the power generated by the natural-energy power generation unit 1. The storage battery system 3 is charged with surplus electric power of the natural-energy power generation unit 1 on the basis of the measurement result of the power meter 2, and discharges power to make up for underpower and superimposes the power on the power generated by the natural-energy power generation unit 1 for output. The transformer 4 converts the voltage of the output power from the natural-energy power generation unit 1 (including power on which the output power from the storage battery system 3 is superimposed). The storage battery controller 5 locally controls the storage battery system 3. The host control device 6 remotely controls the storage battery controller 5.

Figure 2:
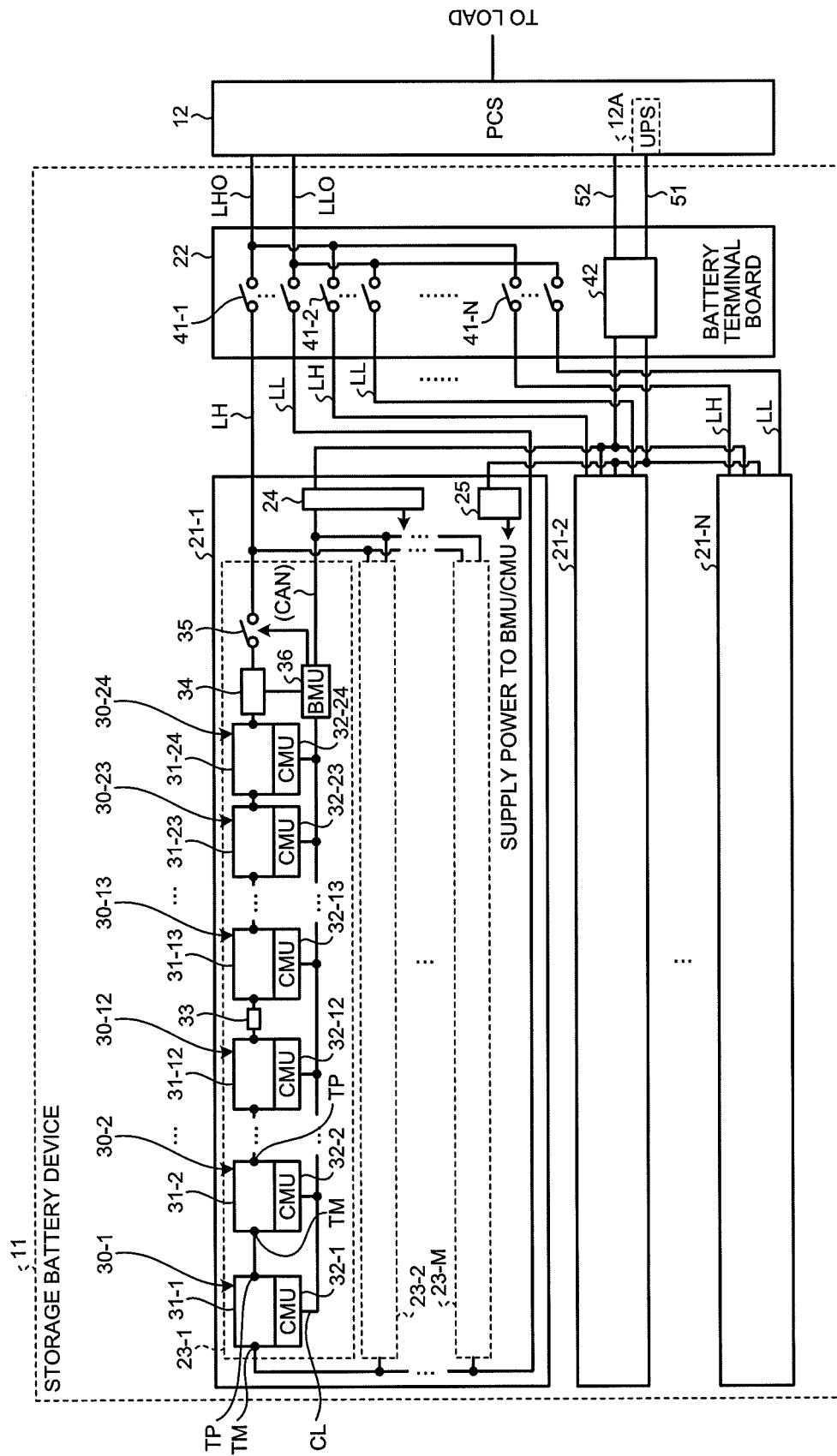
FIG. 2 is a schematic configuration block diagram of the storage battery system according to the embodiment.

FIG. 2 is a schematic configuration block diagram of the storage battery system according to the embodiment. The storage battery system 3 includes a storage battery device 11 that stores therein electric power, and a power conditioning system (PCS) 12 that converts direct-current power supplied from the storage battery device 11 into alternating-current power having a desired power quality and supplies the alternating-current power to a load.

The storage battery device 11 includes a plurality of battery board units 21-1 to 21-N (N being a natural number), and a battery terminal board 22 connected to the battery board units 21-1 to 21-N.

The battery board units 21-1 to 21-N include a plurality of battery boards 23-1 to 23-M (M being a natural number) that are connected to each other in parallel, a gateway device 24, and a direct-current power supply device 25 that supplies direct-current power to a battery management unit (BMU) and cell monitoring units (CMUs) for operation, which will be described below.

A configuration of the battery boards will now be described.

Each of the battery boards 23-1 to 23-M is connected to output power supply lines (buses) LHO and LLO via a high-potential power supply line LH and a low-potential power supply line LL, and supplies electric power to the PCS 12 being a main circuit.

The battery boards 23-1 to 23-M have the same configuration, therefore, the battery board 23-1 is explained as an example.

The battery board 23-1 includes a plurality (24 in FIG. 2) of secondary battery packs 30-1 to 30-24, a service disconnect 33 provided between the secondary battery pack 30-12 and the secondary battery pack 30-13, a current sensor 34, and a contactor 35. The secondary battery packs 30-1 to 30-24, the service disconnect 33, the current sensor 34, and the contactor 35 are connected in series.

In the configuration described above, the secondary battery packs 30-1 to 30-24 each include a storage battery module and a CMU. The whole secondary battery packs 30-1 to 30-24 include a plurality of storage battery modules 31-1 to 31-24, and a plurality (24 in FIG. 2) of CMUs 32-1 to 32-24 included in the storage battery modules 31-1 to 31-24, respectively.

The storage battery modules 31-1 to 31-24 form a battery pack in which battery cells are connected in series and in parallel. The storage battery modules 31-1 to 31-24 connected in series form a battery pack group.

The battery board 23-1 also includes a BMU 36 connected to the communication line of each of the CMUs 32-1 to 32-24 and the output line of the current sensor 34.

Under the control of the gateway device 24, the BMU 36 controls the entire battery board 23-1, and opens and closes the contactor 35 on the basis of a result of the communication (voltage data and temperature data, which will be described below) with each of the CMUs 32-1 to 32-24 and a result of the detection of the current sensor 34.

Next, a configuration of the battery terminal board 22 will be described.

The battery terminal board 22 includes a plurality of board breakers 41-1 to 41-N corresponding to the battery board units 21-1 to 21-N, and a master device 42 being a microcomputer for controlling the entire storage battery device 11.

The master device 42 and the PCS 12 are connected via a control power supply line 51 through which power is supplied to the master device 12 via an uninterruptible power system (UPS) 12A of the PCS 12 and a control communication line 52 being Ethernet (registered trademark) for transfer of control data.

A detailed configuration of the secondary battery packs 30-1 to 30-24 will now be described.

Figure 3:
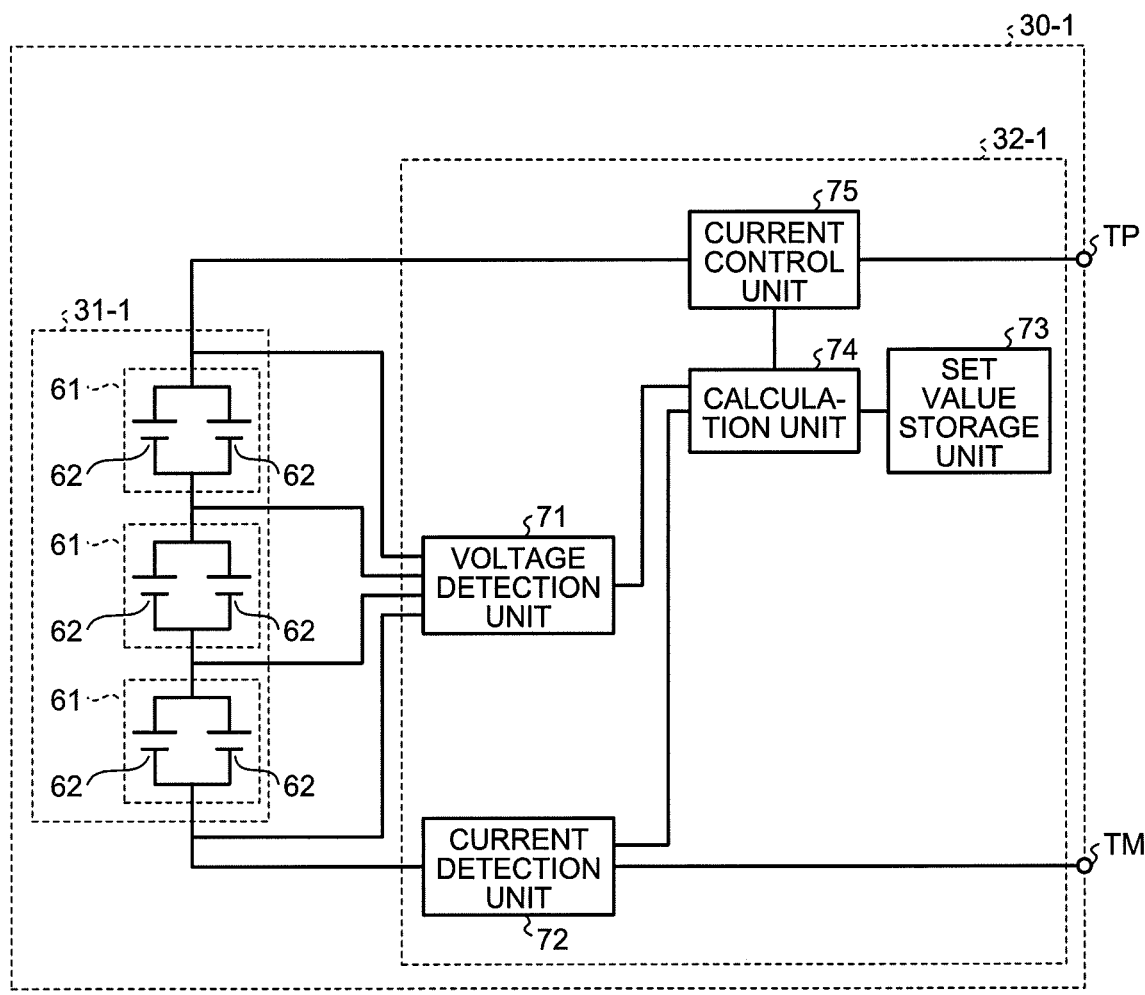
FIG. 3 is a diagram for explaining a detailed configuration of a secondary battery pack.

FIG. 3 is a diagram for explaining a detailed configuration of a secondary battery pack.

The secondary battery packs 30-1 to 30-24 have the same configuration, therefore, the secondary battery pack 30-1 is explained as an example below.

The storage battery module 31-1 of the secondary battery pack 30-1 includes a plurality (three in FIG. 3) of parallel cell blocks 61 that are connected in series, and each of the parallel cell blocks 61 includes a plurality (two in FIG. 3) of battery cells 62 that are connected to each other in parallel.

The CMU 32-1 of the secondary battery pack 30-1 includes a voltage detector 71, a current detector 72, a set-value storage 73, a calculator 74, and a current control 75. The voltage detector 71 detects voltage of each of the parallel cell blocks 61. The current detector 72 detects conduction current of the storage battery module 31-1 with a shunt resistor or a hall current transformer (CT), for example. The set-value storage 73 stores in advance various types of set-value data such as set-value data for anomaly determination (reference direct-current internal resistance ratio) on the storage battery module 31-1. The calculator 74 receives output signals from the voltage detector 71 and the current detector 72, calculates the direct-current internal resistance of each of the parallel cell blocks 61, and determines an non-normal battery cell by comparing a ratio of the calculated direct-current internal resistances of the parallel cell blocks 61 and a value of the set-value data in the set-value storage 73. The current control 75 includes a mechanical switch or a semiconductor switch, and shuts off a charge and discharge circuit to stop charging and discharging to and from the storage battery module 31-1 when the calculator 74 determines an anomaly in the battery cells.

In the configuration described above, the storage battery module 31-1 is connected to an external device such as a charge and discharge device, a load, or a charger, via a positive electrode terminal TP and a negative electrode terminal TM to supply and receive electric power.

Figure 4:
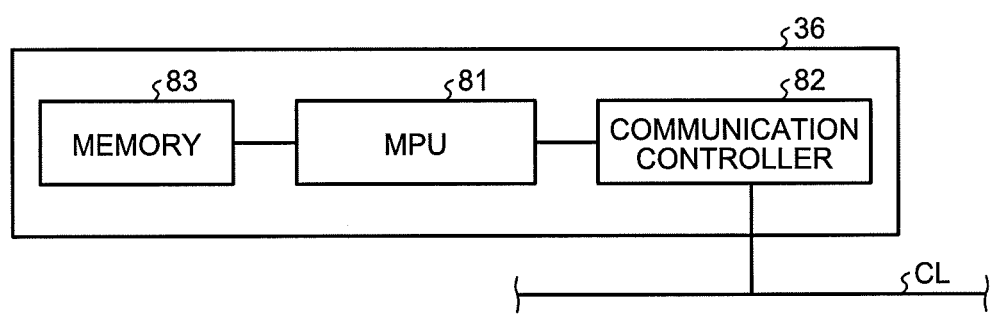
FIG. 4 is a diagram for explaining a detailed configuration of a BMU.

FIG. 4 is a diagram for explaining a detailed configuration of a BMU.

The BMU 36 is configured to be able to communicate with the secondary battery packs 30-1 to 30-24 via a communication line CL (see FIG. 2). The BMU 36 includes an MPU 81 that controls the entire BMU 36, a communication controller 82 that conforms to the control area network (CAN) standard to perform CAN communication with the CMUs 32-1 to 32-24, and a memory 83 that stores voltage data and temperature data transmitted from the CMUs 32-1 to 32-24.

The storage battery controller 5 detects electric power generated by the natural-energy power generation unit 1, and controls the storage battery device 11 to reduce variation in the output of the generated electric power, to relieve influence of the generated electric power on the power grid. The storage battery controller 5 or the host control device 6 calculates a decrease amount of the variation for the storage battery device 11, and provides it to the PCS (Power Conditioning System) 12 corresponding to the storage battery device 11 as a charge and discharge command.

As described above, the board breakers 41-1 to 41-N correspond to the battery board units 21-1 to 21-N.

The board breakers 41-1 to 41-N are sequentially turned on (closed) upon startup of the storage battery system 3. Thereby, the storage battery system 3 is connected to the main circuit, allowing the storage battery to be charged or discharged.

First Embodiment

Figure 5:
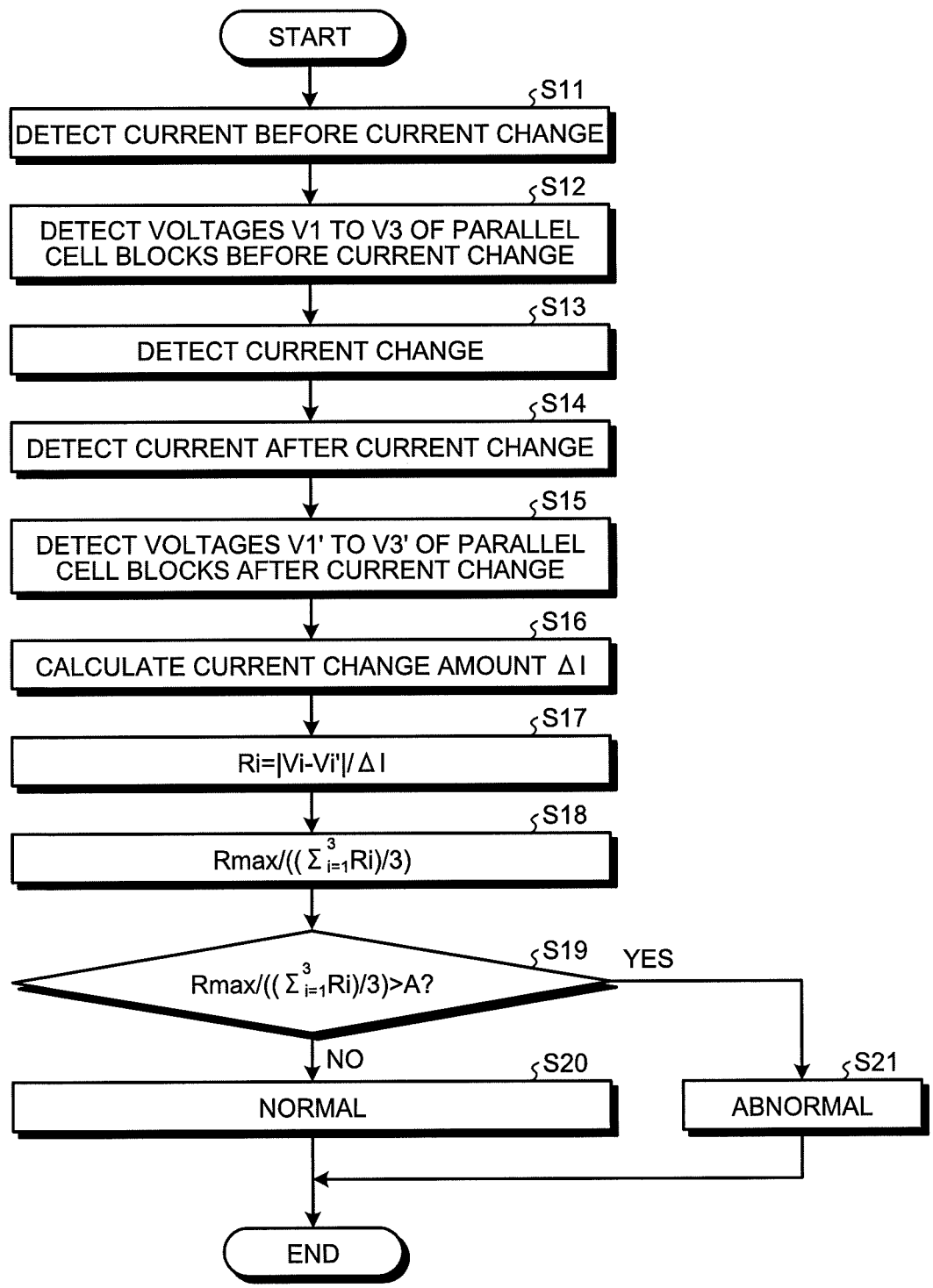
FIG. 5 is a process flowchart of an anomaly detection process in a first embodiment.

FIG. 5 is a process flowchart of an anomaly detection process in a first embodiment.

In the following, an anomaly detection operation by the CMU 32-1 will be described by way of example.

In this case, the voltage detector 71 of the CMU 32-1 detects voltage at predetermined timing (voltage detection timing), and outputs detected voltage data to the calculator 74.

Similarly, the current detector 72 of the CMU 32-1 detects current at predetermined timing (current detection timing), and outputs detected current data to the calculator 74.

Consequently, the calculator 74 constantly monitors variation or non-variation in the current. The calculator 74 detects current with no predetermined variation (before variation in the current) at certain timing (current detection timing), and stores the detected current as detected current data with no variation in the detected current (step S11).

In this case, the current value before current variation detected by the current detector 72 only needs to be continuously substantially constant, therefore, the current need not be limited to current in a non-conduction state. For example, a stationary large-capacity storage battery continuously charges and discharges without stop for the purpose of frequency or voltage adjustment, however, the current thereof can be used as the current before the current variation. Thus, the external device to be connected via the positive electrode terminal TP and the negative electrode terminal TM may be a charge and discharge device, a charger, or a load. In other words, there is no particular limitation to the external device as long as the environment that the conduction current of the storage battery module 31-1 varies is created.

Next, the calculator 74 detects voltage (in the example of FIG. 3, detected voltages V1 to V3 corresponding to the three parallel cell blocks 61) of each of the parallel cell blocks 61 with no current variation (before current variation) at predetermined timing (voltage detection timing), from the output of the voltage detector 71, and stores the detected voltage as detected voltage data with no current variation (the detected voltages V1 to V3 in the above example) (step S12).

The calculator 74 then detects a variation in the current in the storage battery module 31-1 from the output from the current detector 72 (step S13).

Upon detecting the current variation, the calculator 74 detects the varied current (after the current variation) at predetermined timing (current detection timing), and stores the detected current as detected current data after the current variation (step S14).

Next, the calculator 74 detects the varied voltage (in the example of FIG. 3, detected voltages V1' to V3' corresponding to the three the parallel cell blocks 61) of each of the parallel cell blocks 61 after the current variation at predetermined timing (voltage detection timing), from the output of the voltage detector 71. The calculator 74 then stores the detected voltage (detected voltages V1' to V3' in the above example) as detected voltage data after the current variation (step S15).

In this example, in principle the voltage detection timing and the current detection timing coincides with each other. However, the voltage detection timing and the current detection timing may shift from each other as long as the current is stable and does not vary after the current variation.

The calculator 74 then calculates a current variation amount $\Delta I$ by subtracting a current value corresponding to the detected current data before the current variation from a current value corresponding to the detected current data after the current variation (step S16).

The calculator 74 then finds differences in voltage (=V1'−V1, V2'−V2, V3'−V3) among the parallel cell blocks by subtracting the voltages V1 to V3 of the parallel cell blocks 61 corresponding to the detected voltage data before the current variation acquired at step S12 from the voltages V1' to V3' of the parallel cell blocks 61 corresponding to the detected voltage data after the current variation acquired at step S15, respectively. The calculator 74 then calculates a direct-current internal resistance value of each of the parallel cell blocks 61 by dividing the voltage difference by the current variation amount $\Delta I$ calculated by the current variation-amount calculation (step S16)(step S17).

More specifically, a direct-current internal resistance R1 of the first parallel cell block 61 is represented by the following formula:

$$R1=(V1'-V1)/\Delta I.$$

Similarly, a direct-current internal resistance R2 of the second parallel cell block 61 and a direct-current internal resistance R3 of the third parallel cell block 61 are represented by the following formulae:

$$R2=(V2'-V2)/\Delta I$$

$$R3=(V3'-V3)/\Delta I.$$

The calculator 74 then calculates a ratio RT of the maximum value Rmax (=numerator) to the average value (=denominator) of the acquired direct-current internal resistances R1 to R3 (step S18).

More specifically, the calculator 74 first specifies the maximum direct-current internal resistance Rmax from the direct-current internal resistances R1 to R3 of the parallel cell blocks 61 calculated at step S17.

The calculator 74 then calculates the average value of the direct-current internal resistances=(R1+R2+R3)/3.

The calculator 74 then calculates the ratio RT of the maximum direct-current internal resistance Rmax to the average value of the direct-current internal resistances by the following formula:

$$RT=Rmax/((R1+R2+R3)/3).$$

The calculator 74 then compares the ratio RT and a predetermined set value A for cell anomaly detection to determine whether there is a non-normal cell (step S19).

The set value A is typically set in the range of 1.2 or more to 2.0 or less.

When the ratio RT is greater than the set value A in the determination of step S19, that is, when RT>A (Yes at step S19), the calculator 74 determines that there is a non-normal cell (step S21).

When the ratio RT is equal to or less then the set value A in the determination of step S19, that is, when RT≤A (No at step S19), the calculator 74 determines that there is no non-normal cell and all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the first embodiment, the CMU 32-1 determines an anomaly in the parallel cell block 61 from the ratio RT of the maximum direct-current internal resistance Rmax to the average value of the direct-current internal resistances (R1+R2+R3)/3. Consequently, with presence of a battery cell with an extremely low direct-current internal resistance (battery cell with excellent performance), the CMU 32-1 can reduce the influence of the battery by averaging and accurately detect the parallel cell block 61 exhibiting a high direct-current internal resistance.

In the above, the anomaly detection of the parallel cell blocks 61 is described. Alternatively, it is possible to calculate the direct-current internal resistance of the storage battery modules 31-1 to 31-24 to determine a storage battery module with a high ratio as non-normal by a similar method.

Second Embodiment

Figure 6:
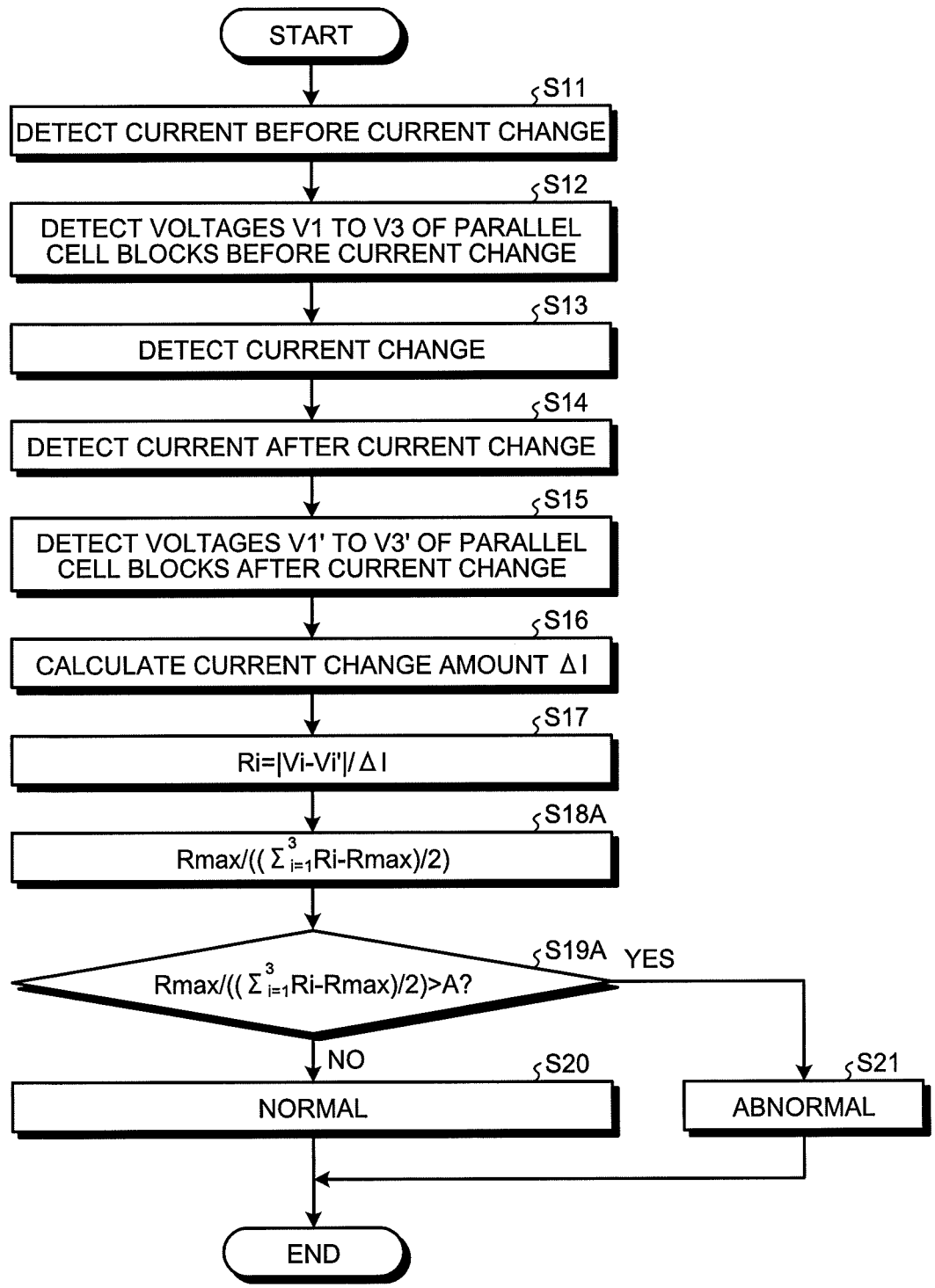
FIG. 6 is a process flowchart of an anomaly detection process in a second embodiment.

FIG. 6 is a process flowchart of an anomaly detection process in a second embodiment.

In FIG. 6, the same parts as those in FIG. 5 are denote by the same reference numerals.

In the first embodiment, anomaly in the parallel cell block 61 is determined from the ratio RT of the maximum direct-current internal resistance Rmax to the average value (R1+R2+R3)/3 of the direct-current internal resistances. The second embodiment is different from the first embodiment in that anomaly in the parallel cell block 61 is determined from a ratio RT1 that is calculated on the basis of the maximum direct-current internal resistance value Rmax and the average value of the direct-current internal resistance values excluding the direct-current internal resistance value corresponding to the maximum direct-current internal resistance value Rmax among the direct-current internal resistance values R1 to R3, instead of the ratio RT of the first embodiment.

Hereinafter, different points will be mainly described.

First, the secondary battery pack 30-1 performs the operations from step S11 to step S17 as in the first embodiment.

The calculator 74 then calculates the ratio RT1 between the maximum value Rmax (=numerator) of the acquired direct-current internal resistance values R1 to R3 and the average value of the direct-current internal resistance values excluding the direct-current internal resistance value corresponding to the maximum direct-current internal resistance value Rmax among the direct-current internal resistance values R1 to R3 (step S18A).

More specifically, the calculator 74 first specifies the maximum direct-current internal resistance Rmax from the direct-current internal resistances R1 to R3 of the parallel cell blocks 61 calculated at step S17.

The calculator 74 then calculates a value by subtracting the maximum value Rmax from the sum of the direct-current internal resistances=(R1+R2+R3), that is (R1+R2+R3)−Rmax.

More specifically, when the direct-current internal resistance R2=Rmax, $$(R1 + R2 + R3) - Rmax = (R1 + R2 + R3) - R2$$
$$= (R1 + R3).$$

The value resulting from (R1+R2+R3)−Rmax is the sum of the direct-current internal resistance values excluding the maximum direct-current internal resistance value Rmax.

Thus, in this case, the average value of the direct-current internal resistance values excluding the maximum direct-current internal resistance value Rmax can be found by dividing the value obtained by subtracting the maximum value Rmax from the sum of the direct-current internal resistances=(R1+R2+R3) by two. When the number of the direct-current internal resistance values calculated in this manner is m, the average value of the direct-current internal resistance values excluding the maximum direct-current internal resistance value Rmax can be found by dividing, by (m−1), the value found by subtracting the maximum direct-current internal resistance value Rmax from the sum of the direct-current internal resistances.

The calculator 74 then calculates the ratio RT1 of the maximum direct-current internal resistance Rmax to the average value of the direct-current internal resistance values excluding the maximum value Rmax by the following formula:

$RT1 = Rmax/[\{(R1+R2+R3) - Rmax\}/2]$.

When the number of the direct-current internal resistance values calculated as above is m, the ratio RT1 of the maximum direct-current internal resistance Rmax to the average value of the direct-current internal resistance values excluding the maximum direct-current internal resistance value Rmax is calculated by the following formula:

$RT1 = Rmax/[\{(R1+R2+ \ldots +Rm) - Rmax\}/(m-1)]$.

The calculator 74 then determines whether there is an anomaly in the cells by comparing the ratio RT1 and a certain set value A for cell anomaly detection (step S19A).

The set value A is typically set in the range of 1.2 or more to 2.0 or less.

When the ratio RT1 is greater than the set value A in the determination of step S19A, that is, when RT1>A (No at step S19A), the calculator 74 determines presence of a non-normal cell (step S21).

When the ratio RT1 is equal to or less than the set value A in the determination of step S19A, that is, when RT1≤A (Yes at step S19A), the calculator 74 determines that there is no non-normal cell and all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the second embodiment, a difference between the maximum direct-current internal resistance value Rmax and the average value of the direct-current internal resistance values excluding the direct current direct-current internal resistance value corresponding the maximum direct-current internal resistance value Rmax among the direct-current internal resistance values R1 to R3 and the maximum direct-current internal resistance value Rmax is further increased, which can further ensure detection of the parallel cell block 61 having a high direct-current internal resistance.

Third Embodiment

Figure 7:
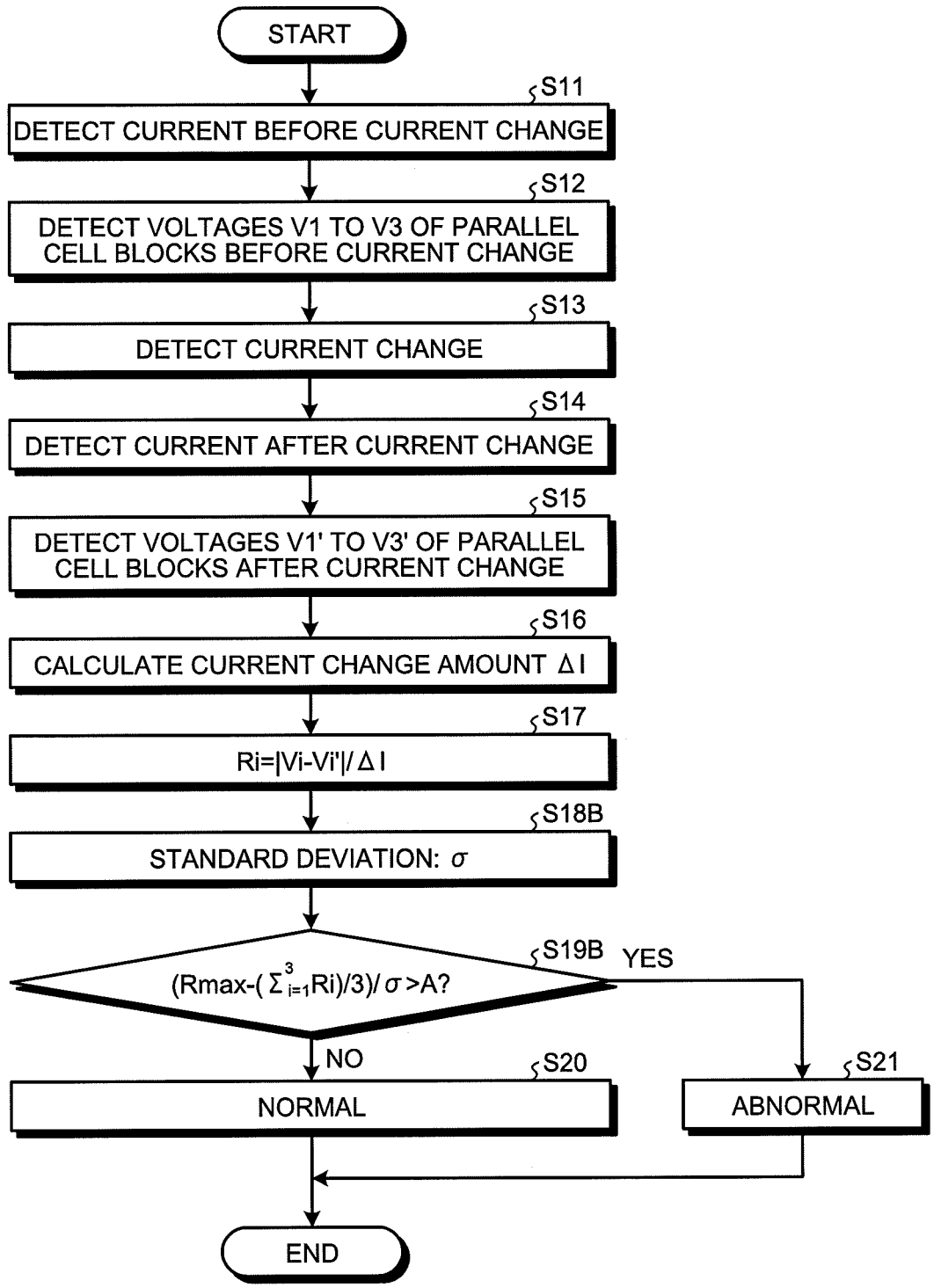
FIG. 7 is a process flowchart of an anomaly detection process in a third embodiment.

FIG. 7 is a process flowchart of an anomaly detection process in a third embodiment.

In FIG. 7, the same parts as those in FIG. 5 are denoted by the same reference numerals.

In the first embodiment, an anomaly in the parallel cell block 61 is determined from the ratio RT of the maximum direct-current internal resistance Rmax to the average value of the direct-current internal resistance (R1+R2+R3)/3. The third embodiment is different from the first embodiment in that an anomaly in the parallel cell block 61 is determined from a ratio RT2 that is calculated on the basis of the maximum direct-current internal resistance value Rmax and a value found by dividing the average value of the direct-current internal resistance values by a standard deviation α of the direct-current internal resistance values, instead of the ratio RT of the first embodiment.

In this example, the ratio RT2 is used for determining whether the maximum direct-current internal resistance Rmax is an outlier (a value greatly deviated from the other values) relative to the rest of the direct-current internal resistance values.

Hereinafter, different points will be mainly described.

First, the secondary battery pack 30-1 performs the operations from step S11 to step S17 in the first embodiment.

The calculator 74 then calculates a standard deviation of the direct-current internal resistance values (step S18B).

More specifically, the calculator 74 finds the average value of the direct-current internal resistances R1 to R3 (R1+R2+R3)/3 calculated at step S17, and calculates the standard deviation σ by the following formula.

$$\sigma = \sqrt{\frac{1}{3}\left(\sum_{i=1}^{3} Ri - (R1 + R2 + R3)/3\right)} \quad (1)$$

The calculator 74 then calculates the ratio RT2 of the difference Rmax−(R1+R2+R3)/3 between the maximum direct-current internal resistance Rmax and the average value relative to the calculated standard deviation σ.

$RT2=(Rmax-(R1+R2+R3)/3)/\sigma$

The calculator 74 then determines whether there is an anomaly in the cells by comparing the ratio RT2 and a certain set value A for cell anomaly detection (step S19B).

The set value A is typically set in the range of 1.2 or more to 2.0 or less.

When the ratio RT2 is greater than the set value A in the determination of step S19B, that is, when RT2>A (No at step S19B), the calculator 74 determines presence of an non-normal cell (step S21).

When the ratio RT2 is equal to or less than the set value A in the determination of step S19B, that is, when RT2≤A (Yes at step S19B), the calculator 74 determines that there is no non-normal cell and all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the third embodiment, it is possible to detect the parallel cell block 61 having a high direct-current internal resistance as an non-normal deviation value of the standard deviation σ that corresponds to the distribution of the direct-current internal resistance.

Fourth Embodiment

Figure 8:
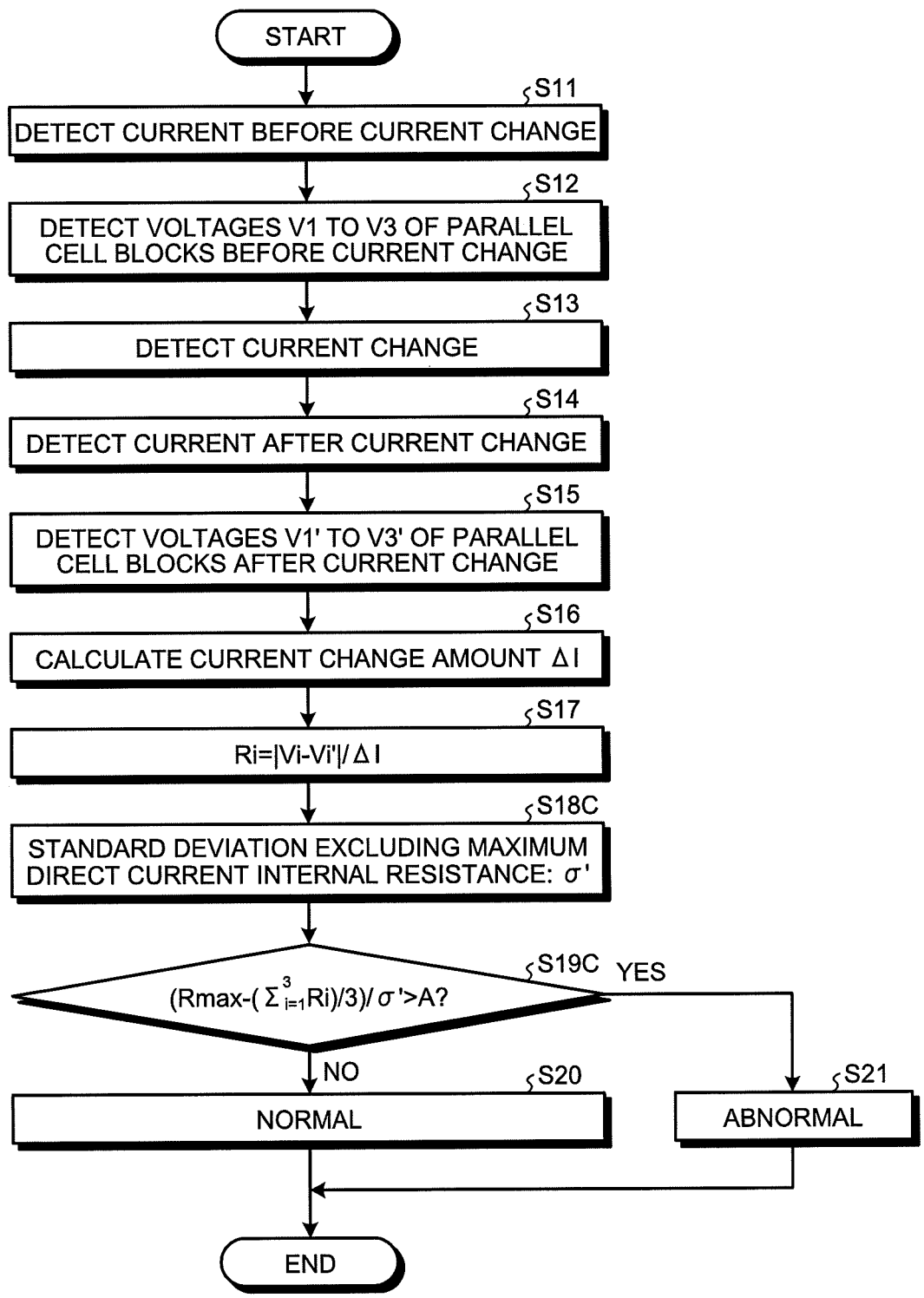
FIG. 8 is a process flowchart of an anomaly detection process in a fourth embodiment.

FIG. 8 is a process flowchart of an anomaly detection process in a fourth embodiment.

In FIG. 8, the same parts as those in FIG. 5 are denoted by the same reference numerals.

In the first embodiment, an anomaly in the parallel cell block 61 is determined from the ratio RT of the maximum direct-current internal resistance Rmax to the average value of the direct-current internal resistances (R1+R2+R3)/3. The fourth embodiment is different from the first embodiment in that an anomaly in the parallel cell block 61 is determined from a ratio RT3 that is calculated on the basis of a value found by dividing the difference between the maximum value Rmax and the average value of the direct-current internal resistance values by a standard deviation σ' of the direct-current internal resistance values excluding the maximum direct-current internal resistance value Rmax, instead of the ratio RT of the first embodiment.

Hereinafter, different points will be mainly described.

First, the secondary battery pack 30-1 performs the operations from step S11 to step S17 in the first embodiment.

The calculator 74 then calculates a standard deviation of the direct-current internal resistance values (step S18C).

More specifically, at step S17, the calculator 74 finds the average value of the direct-current internal resistance values excluding the maximum direct-current internal resistance value from the calculated sum of the direct-current internal resistances R1 to R3 (R1+R2+R3−Rmax)/2, and calculates the standard deviation σ' by the following formula.

$$\sigma' = \sqrt{\frac{1}{2}\left(\sum_{i=1}^{3} Ri - (R1 + R2 + R3 - R\max)/2\right)} \quad (2)$$

The calculator 74 then calculates the ratio RT3 of the difference Rmax−(R1+R2+R3)/3 between the maximum direct-current internal resistance Rmax and the average value relative to the calculated standard deviation σ'.

$RT3=(Rmax-(R1+R2+R3)/3)/\sigma'$

The calculator 74 then determines whether there is an anomaly in the cells by comparing the ratio RT3 and a predetermined set value A for cell anomaly detection (step S19C).

The set value A is typically set in the range of 1.2 or more to 2.0 or less.

When the ratio RT3 is greater than the set value A in the determination of step S19C, that is, when RT3>A (No at step S19C), the calculator 74 determines presence of a non-normal cell (step S21).

When the ratio RT3 is equal to or less than the set value A in the determination of step S19C, that is, when RT3≤A (Yes at step S19C), the calculator 74 determines that there is no non-normal cell and that all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the fourth embodiment, it is possible to accurately detect the parallel cell block 61 having a high direct-current internal resistance as a non-normal deviation value of the standard deviation σ' that corresponds to the distribution of the direct-current internal resistances, with the influence of the maximum direct-current internal resistance removed.

Fifth Embodiment

Figure 9:
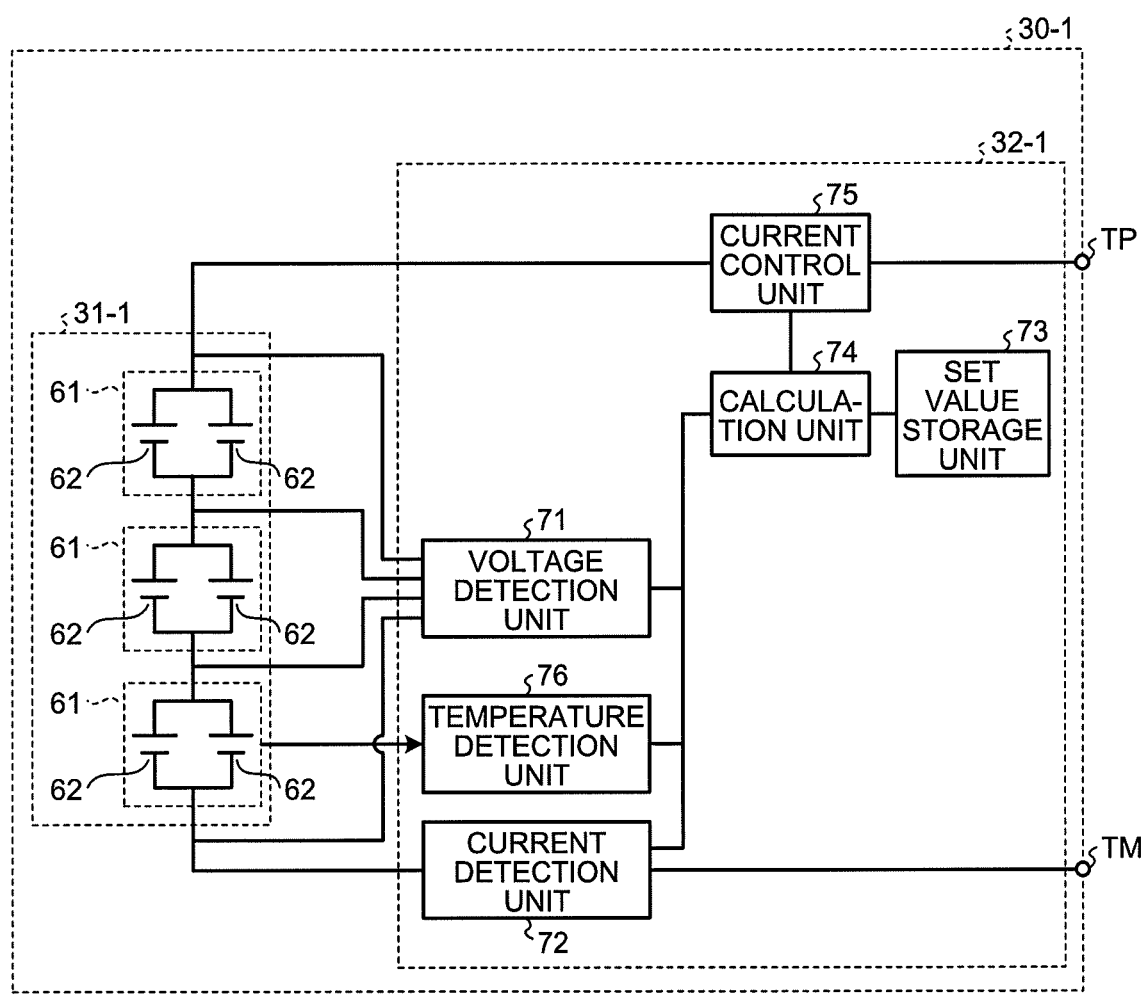
FIG. 9 is a diagram for explaining a detailed configuration of a secondary battery pack of a fifth embodiment.

FIG. 9 is a diagram for explaining a detailed configuration of a secondary battery pack of a fifth embodiment.

In FIG. 9, the same elements as those in FIG. 3 are denoted by the same reference numerals.

FIG. 9 is different from FIG. 3 in the addition of a temperature detector 76 that detects the temperature of the storage battery module 31-1.

The temperature detector 76 may be a single temperature sensor (temperature detector) connected to the storage battery module 31-1 to measure the ambient temperature of the storage battery module 31-1, a plurality of temperature sensors placed inside the storage battery module 31-1 considering the temperature distribution in the storage battery module 31-1, a temperature sensor provided in one of the battery cells 62 rising highest in temperature in the storage battery module 31-1 on the premise that the storage battery module 31-1 uniformly rises in temperature, or a temperature sensor used upon estimation of a temperature increase in the battery cells 62 according to temperature distribution.

Figure 10:
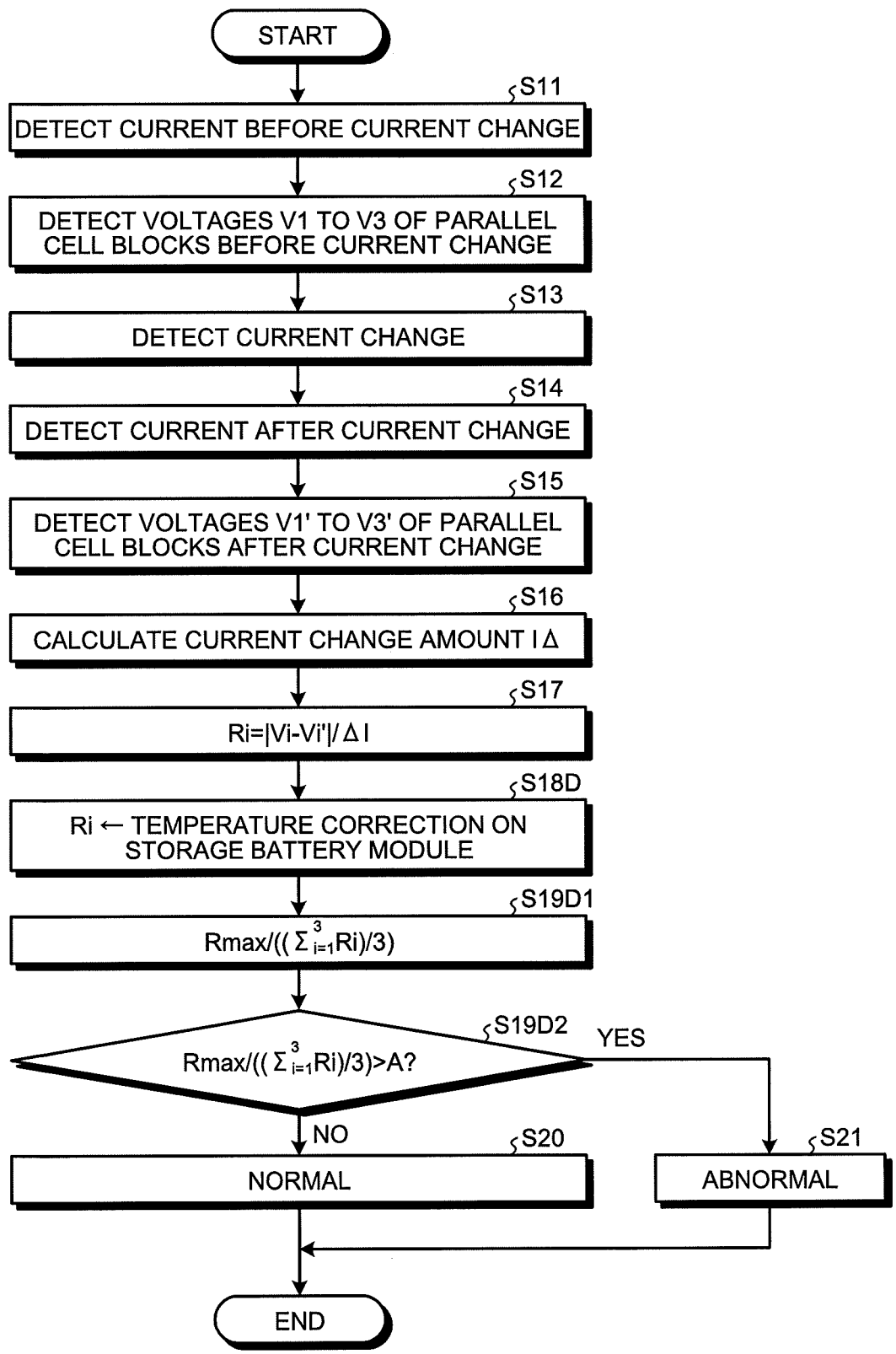
FIG. 10 is a process flowchart of an anomaly detection process in the fifth embodiment.

FIG. 10 is a process flowchart of an anomaly detection process in the fifth embodiment.

In FIG. 10, the same parts as those in FIG. 5 denote the same reference numerals.

In the first embodiment, the measured direct-current internal resistance values R1, R2, and R3 are used without change. The fifth embodiment is different from the first embodiment in that the measured direct-current internal resistance values R1, R2, and R3 are corrected on the basis of temperature information of the storage battery module 31-1 detected by the temperature detector 76 and determines anomaly on the basis of the corrected direct-current internal resistance values.

Hereinafter, different points will be mainly described.

First, the secondary battery pack 30-1 performs the operations from step S11 to step S17 in the first embodiment.

The calculator 74 then calculates, on the basis of a temperature detection signal of the storage battery module 31-1 output from the temperature detector 76, a temperature correction for the direct-current internal resistance values R1 to R3 calculated as in the first embodiment so as to eliminate the influence of temperature (step S18D).

The temperature-correction calculation will now be described in detail.

Typically, the higher the battery temperature is, the lower the direct-current internal resistance is, and the lower the battery temperature is, the higher the direct-current internal resistance is.

In the fifth embodiment, thus, when the temperature detected by the temperature detector 76 (for example, 30° C. higher than the reference temperature by 10° C.) is higher than a predetermined reference temperature (for example, 20° C.), the direct-current internal resistance values R1 to R3 are corrected to smaller values at a predetermined ratio (for example, 1%), or a database containing converted values of the direct-current internal resistance values relative to temperatures is pre-stored to correct the measured direct-current internal resistance values R1 to R3 referring to the database.

The calculator 74 then calculates the ratio RT of the maximum direct-current internal resistance Rmax to the average value of the corrected direct-current internal resistances by the following formula (step S19D1):

$$RT = R\max/((R1+R2+R3)/3).$$

The calculator 74 then determines whether there is an anomaly in the cells by comparing the ratio RT and a predetermined set value A for cell anomaly detection (step S19D2).

The set value A is set in the range of 1.2 or more to 2.0 or less.

When the ratio RT is greater than the set value A in the determination of step S19D2, that is, when RT>A (No at step S19D2), the calculator 74 determines presence of a non-normal cell (step S21).

When the ratio RT is equal to or less than the set value A in the determination of step S19D2, that is, when RT≤A (Yes at step S19D2), the calculator 74 determines that there is no non-normal cell and that all the cells are normal (step S20).

As a result of the determination, when no non-normal cell is found and that all the cells are normal, the charge and discharge operation continues.

On the other hand, when a non-normal cell is found, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the fifth embodiment, the direct-current internal resistance values of the parallel cell blocks 61 are corrected on the basis of the temperature information of the storage battery module 31-1 from the temperature detector 76, which makes it possible to more accurately detect the parallel cell block 61 exhibiting a high direct-current internal resistance.

Sixth Embodiment

Figure 11:
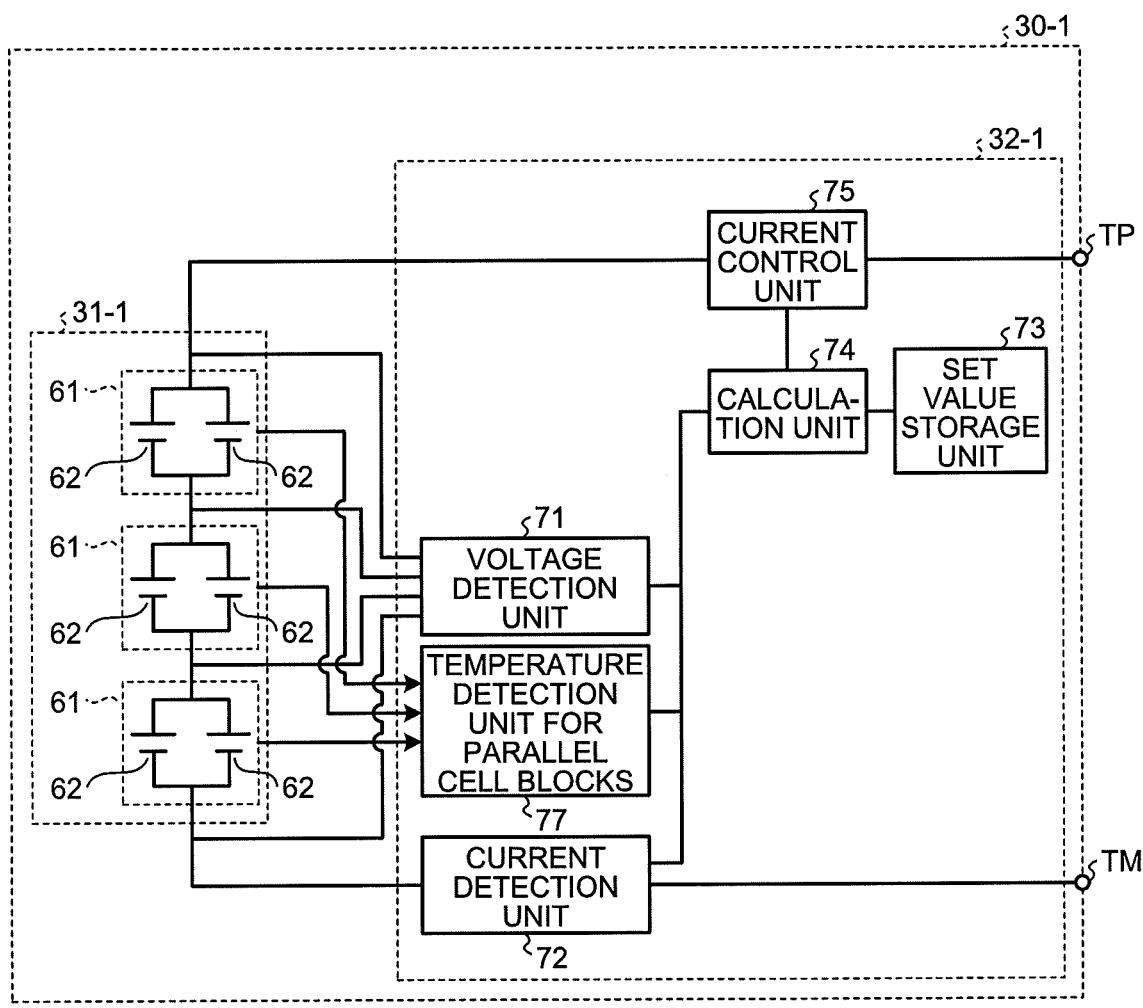
FIG. 11 is a diagram for explaining a detailed configuration of a secondary battery pack of a sixth embodiment.

FIG. 11 is a diagram for explaining a detailed configuration of a secondary battery pack of a sixth embodiment.

In FIG. 11, the same elements as those in FIG. 9 are denoted by the same reference numerals.

FIG. 11 is different from FIG. 9 in the addition of a temperature detector 77 that is connected to all the parallel cell blocks 61 to detect the temperature of each of the parallel cell blocks 61, instead of the temperature detector 76 that detects the temperature of the storage battery module 31-1.

Figure 12:
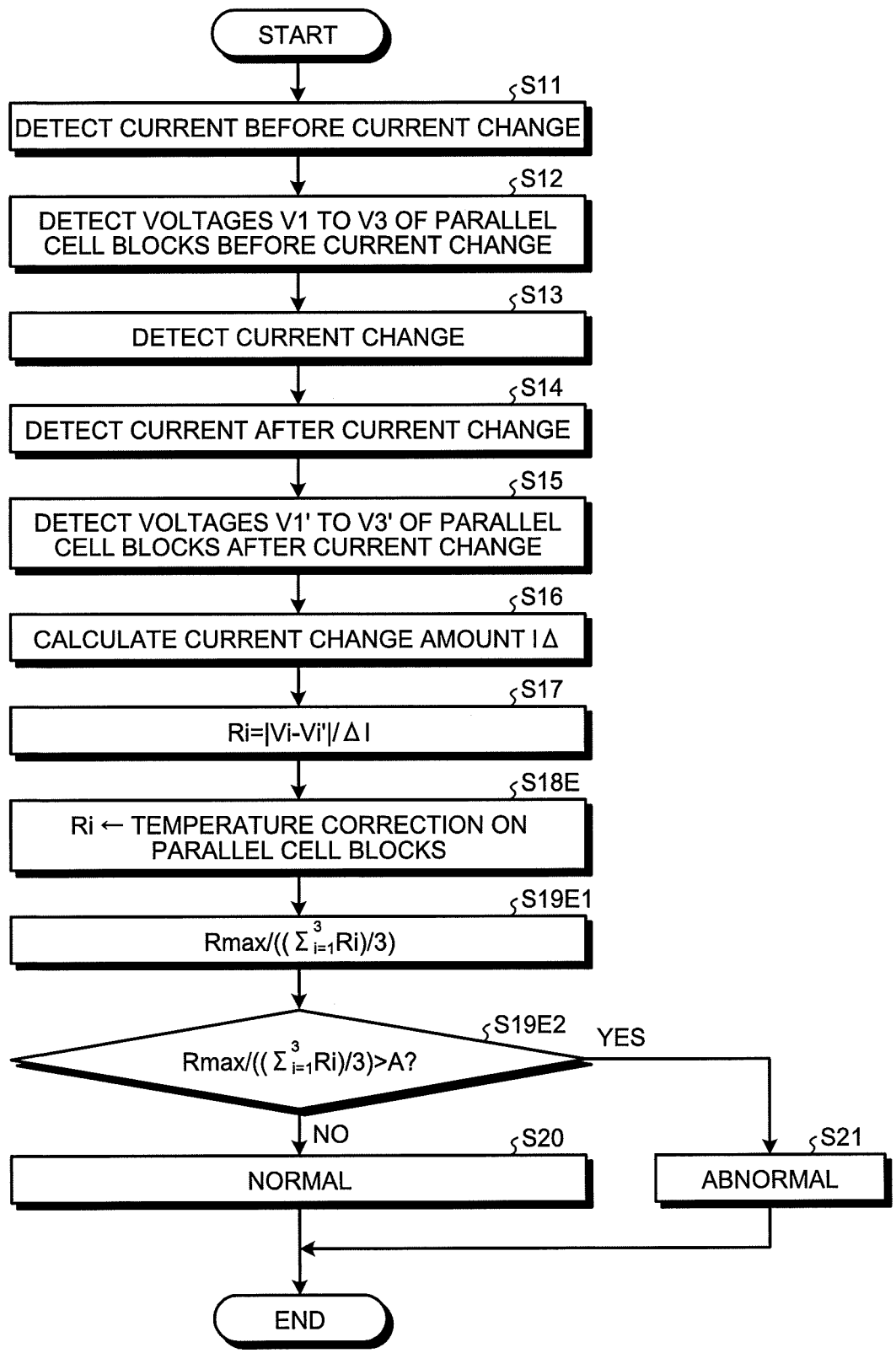
FIG. 12 is a process flowchart of an anomaly detection process in the sixth embodiment.

FIG. 12 is a process flowchart of an anomaly detection process in the sixth embodiment.

In FIG. 12, the same parts as those in FIG. 10 are denoted by the same reference numerals.

In the fifth embodiment, the measured direct-current internal resistance values R1, R2, and R3 are corrected on the basis of temperature information of the storage battery module 31-1 detected by the temperature detector 76 to determine anomaly from the corrected direct-current internal resistance values. The sixth embodiment is different from the fifth embodiment in that the measured direct-current internal resistance values R1, R2, and R3 are corrected on the basis of temperature information of each parallel cell block 61 detected by the temperature detector 76 to determine anomaly from the corrected direct-current internal resistance values.

Hereinafter, different points will be mainly described.

First, the secondary battery pack 30-1 performs the operations from step S11 to step S17 in the first embodiment.

The calculator 74 then calculates, on the basis of a temperature detection signal of the parallel cell block 61 output from the temperature detector 77, a temperature correction for each of the direct-current internal resistance values R1 calculated as in the first embodiment to R3, so as to eliminate the influence of temperature thereon (step S18E).

The calculator 74 then calculates the ratio RT of the maximum direct-current internal resistance Rmax to the average value of the corrected direct-current internal resistances (step S19E1).

$$RT = R\max/((R1+R2+R3)/3))$$

The calculator 74 then determines whether there is an anomaly in the cells by comparing the ratio RT and a predetermined set value A for cell anomaly detection (step S19E2).

The set value A is set in the range of 1.2 or more to 2.0 or less.

When the ratio RT is greater than the set value A in the determination of step S19E2, that is, when RT>A (No at step S19E2), the calculator 74 determines presence of a non-normal cell (step S21).

When the ratio RT is equal to or less than the set value A in the determination of step S19E2, that is, when RT≤A (Yes at step S19E2), the calculator 74 determines that there is no non-normal cell and that all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the sixth embodiment, the direct-current internal resistance values of the parallel cell blocks 61 can be individually corrected on the basis of the temperature information of each of the parallel cell blocks 61 detected by the temperature detector 77. Consequently, it is possible to more accurately detect the parallel cell block 61 exhibiting a high direct-current internal resistance.

Seventh Embodiment

Figure 13:
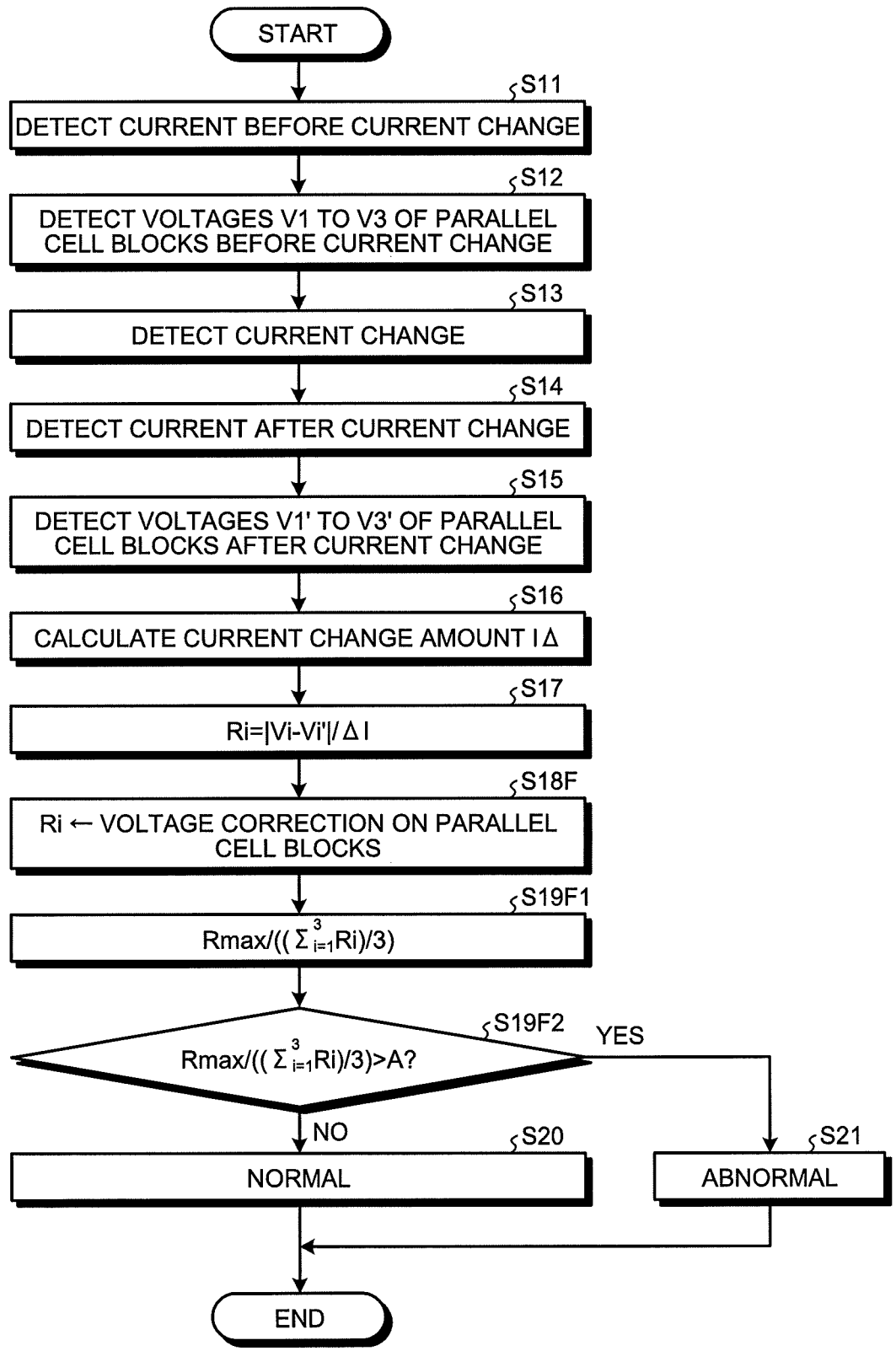
FIG. 13 is a process flowchart of an anomaly detection process in a seventh embodiment.

FIG. 13 is a process flowchart of an anomaly detection process in a seventh embodiment.

In FIG. 13, the same parts as those in FIG. 5 are denoted by the same reference numerals.

In the first embodiment, the measured direct-current internal resistance values R1, R2, and R3 are used without change. The seventh embodiment is different from the first embodiment in that the measured direct-current internal resistance values R1, R2, and R3 are corrected on the basis of the voltage detected by the voltage detector 71.

Hereinafter, different points will be mainly described.

First, the secondary battery pack 30-1 performs the operations from step S11 to step S17 in the first embodiment.

The calculator 74 then calculates, on the basis of a temperature detection signal of each parallel cell block 61 output from the temperature detector 77, a voltage correction for each of the direct-current internal resistance values R1 to R3 calculated as in the first embodiment so as to eliminate the influence of voltage of each of the parallel cell blocks 61 detected by the voltage detector 71 (step S18F).

The calculator 74 then calculates the ratio RT of the maximum direct-current internal resistance Rmax to the average value of the corrected direct-current internal resistances (step S19F1).

$$RT = R\max/((R1+R2+R3)/3)$$

The calculator 74 then determines whether there is an anomaly in the cells by comparing between the ratio RT and a predetermined set value A for cell anomaly detection (step S19F2).

The set value A is typically set in the range of 1.2 or more to 2.0 or less.

When the ratio RT is greater than the set value A in the determination of step S19F2, that is, when RT>A (No at step S19F2), the calculator 74 determines presence of a non-normal cell (step S21).

When the ratio RT is equal to or less then the set value A in the determination of step S19F2, that is, when RT≤A (Yes at step S19F2), the calculator 74 determines that there is no non-normal cell and that all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the seventh embodiment, the direct-current internal resistance values of the parallel cell blocks 61 can be individually accurately corrected in accordance with the voltage detected by the voltage detector 71. Consequently, it is possible to more accurately detect the parallel cell block 61 exhibiting a high direct-current internal resistance.

Eighth Embodiment

Figure 14:
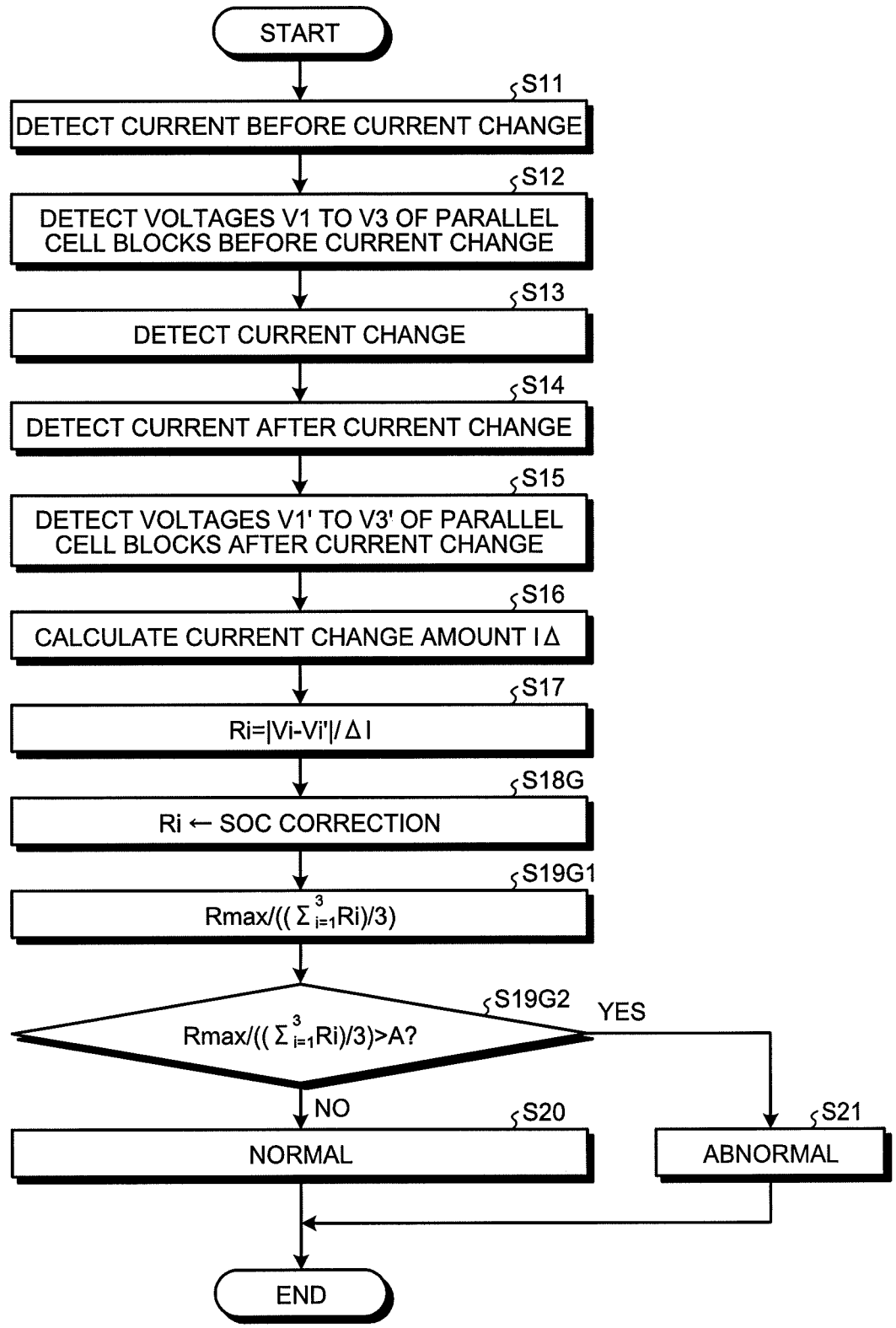
FIG. 14 is a process flowchart of an anomaly detection process in an eighth embodiment.

FIG. 14 is a process flowchart of an anomaly detection process in an eighth embodiment.

In FIG. 14, the same parts as those in FIG. 5 are denoted by the same reference numerals.

In the first embodiment, the measured direct-current internal resistance values R1, R2, and R3 are used without change. The eighth embodiment is different from the first embodiment in that the direct-current internal resistances are corrected in accordance with the remaining amount of the batteries (state of charge (SOC)) of the storage battery module 31-1.

First, the SOC will be described.

The current detector 72 detects the charge and discharge currents of the storage battery module 31-1, and thus the SOC can be calculated by integrating the charge and discharge currents.

Meanwhile, the direct-current internal resistance value varies depending on a difference in the SOC. Thus, the current detector 72 detects the charge and discharge currents of the storage battery module 31-1 and the charge and discharge currents of the parallel cell blocks 61. The calculator 74 calculates the SOC of each of the parallel cell blocks 61 by integrating the detected charge and discharge currents.

The calculator 74 thus corrects the direct-current internal resistances using the calculated SOC.

Hereinafter, different points will be mainly described.

First, the secondary battery pack 30-1 performs the operations from step S11 to step S17 in the first embodiment.

The calculator 74 then calculates the SOC by integrating the charge and discharge currents of the storage battery module 31-1 output from the current detector 72, and individually corrects the direct-current internal resistance values R1 to R3 calculated on the basis of the calculated SOC (step S18G).

The calculator 74 then calculates the ratio RT of the maximum direct-current internal resistance Rmax to the average value of the corrected direct-current internal resistance by the following formula (step S19G1):

$$RT = R\max/((R1+R2+R3)/3).$$

The calculator 74 then determines whether there is an anomaly in the cells by comparing the ratio RT and a predetermined set value A for cell anomaly detection (step S19G2).

The set value A is typically set in the range of 1.2 or more to 2.0 or less.

When the ratio RT is greater than the set value A in the determination of step S19G2, that is, when RT>A (No at step S19G2), the calculator 74 determines presence of a non-normal cell (step S21).

When the ratio RT is equal to or less than the set value A in the determination of step S19G2, that is, when RT≤A (Yes at step S19G2), the calculator 74 determines that there is no non-normal cell and that all the cells are normal (step S20).

As a result of the determination, when no non-normal cell is found and all the cells are normal, the charge and discharge operation continues.

On the other hand, a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

As described above, according to the eighth embodiment, the SOC is found from the current information obtained by the current detector 72 to accurately correct the direct-current internal resistance value of each of the parallel cell blocks 61. Thereby, accurate detection of the parallel cell block 61 exhibiting a high direct-current internal resistance is feasible.

Ninth Embodiment

Figure 15:
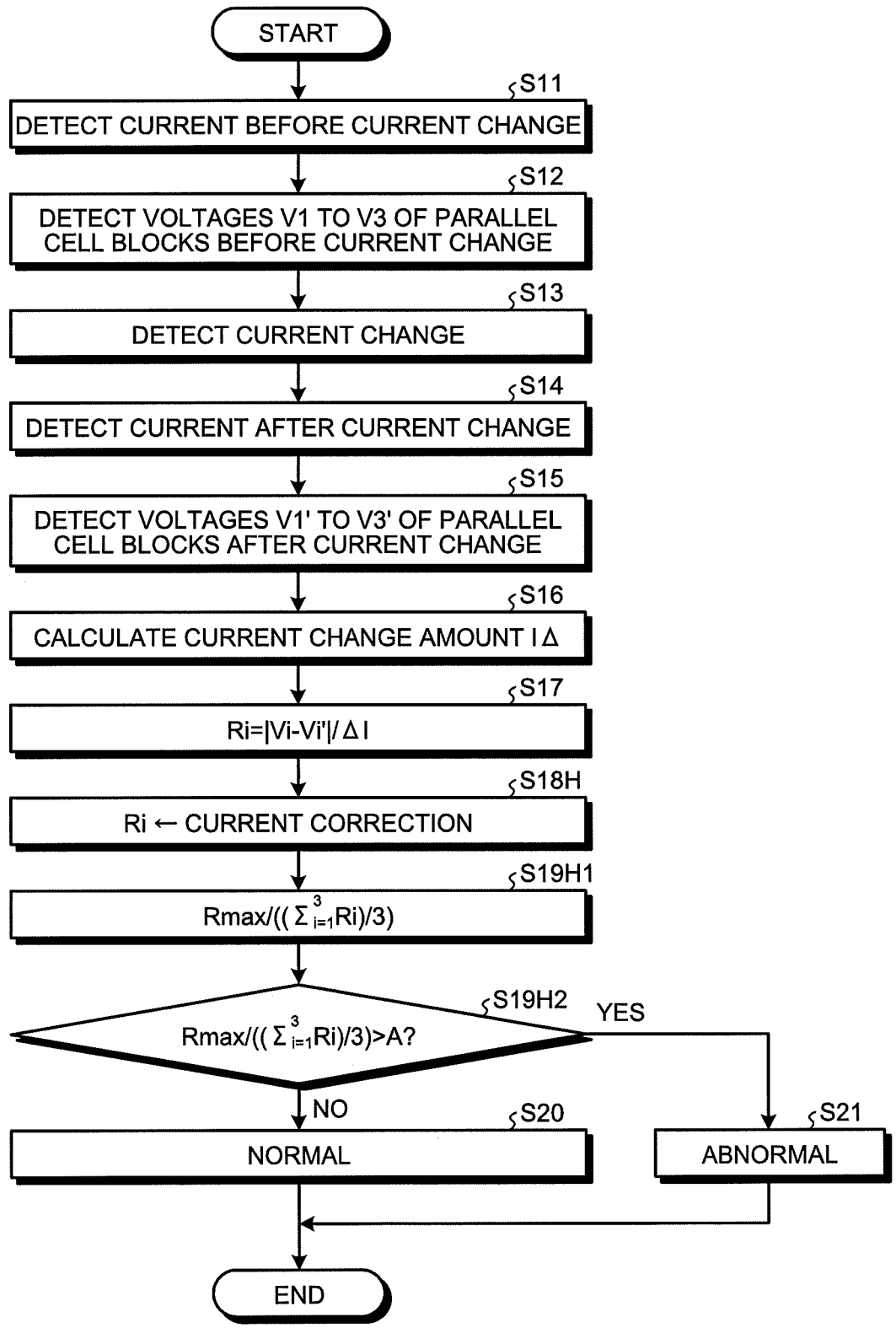
FIG. 15 is a process flowchart of an anomaly detection process in a ninth embodiment.

FIG. 15 is a process flowchart of an anomaly detection process in a ninth embodiment.

In FIG. 15, the same parts as those in FIG. 5 are denoted by the same reference numerals.

In the first embodiment, the measured direct-current internal resistance values R1, R2, and R3 are used without change. The ninth embodiment is different from the first embodiment in that the direct-current internal resistances are corrected in accordance with current values of the charge and discharge currents.

Along with a change in the charge and discharge currents from charge to discharge or from discharge to charge, batteries may show hysteresis characteristics in the voltage curve called open circuit voltage (OCV) and closed circuit voltage (CCV), and as a result, they may excessively vary in voltage.

Thus, in the ninth embodiment, the current detector 72 detects the charge and discharge currents of the storage battery module 31-1 and the charge and discharge currents of the parallel cell blocks 61, and the calculator calculates a correction for the variation in the direct-current internal resistance value of each of the parallel cell blocks 61 on the basis of the detected current values.

Hereinafter, different points will be mainly described.

First, the secondary battery pack 30-1 performs the operations from step S11 to step S17 in the first embodiment.

The calculator 74 then corrects each of the direct-current internal resistance values R1 to R3 calculated on the basis of the charge and discharge currents of the storage battery module 31-1 output from the current detector 72 (step S18H).

The calculator 74 then calculates the ratio RT of the maximum direct-current internal resistance Rmax to the average value of the corrected direct-current internal resistances (step S19H1).

$$RT = R\max/((R1+R2+R3)/3)$$

The calculator 74 then determines whether there is an anomaly in the cells by comparing the ratio RT and a predetermined set value A for cell anomaly detection (step S19H2).

The set value A is typically set in the range of 1.2 or more to 2.0 or less.

When the ratio RT is greater than the set value A in the determination of step S19H2, that is, when RT>A (No at step S19H2), the calculator 74 determines presence of a non-normal cell (step S21).

When the ratio RT is equal to or less than the set value A in the determination of step S19H2, that is, when RT≤A (Yes at step S19H2), the calculator 74 determines that there is no non-normal cell and that all the cells are normal (step S20).

As a result of the determination, when no non-normal cell is found and all the cells are normal, the charge and discharge operation continues.

On the other hand, when a non-normal cell is found as a result of the determination, the switch of the current control 75 is opened to stop charging and discharging to and from the secondary battery pack 30-1, or the external device (for example, the BMU 36, the PCS 12, the storage battery controller 5, or the host control device 6) is notified of the anomaly in the secondary battery pack 30-1 via an information communication channel, and the external device stops the charge and discharge operation to the secondary battery pack 30-1.

According to the ninth embodiment described above, the direct-current internal resistance values of the parallel cell blocks 61 are accurately corrected in accordance with the current values detected by the current detector 72 to accurately detect the parallel cell block 61 exhibiting a high direct-current internal resistance.

While some embodiments of the invention have been described, these embodiments are merely examples, and are not intended to limit the scope of the invention. These novel embodiments may be implemented in various other forms, and various omissions, replacements, and modifications may be made without departing from the scope and spirit of the invention. These embodiments and the modifications are included in the scope and spirit of the invention, and are included in the invention described in the claims and their equivalents.

For example, in the above description the set value A is constant. However, the set value A may be variable with secular change in the system taken into account, or may be changed according to the operation procedure.

The invention claimed is:

1. A cell monitoring unit that is configured to monitor a state of a storage battery module including a plurality of parallel cell blocks connected in series, the parallel cell blocks each including a plurality of battery cells connected in parallel, the cell monitoring unit, comprising:

a current detector that is configured to detect current flowing through the parallel cell blocks;

a current controller including a mechanical switch or a semiconductor switch;

a voltage detector that is configured to detect voltage of each of the parallel cell blocks when the current flowing through the parallel cell blocks is a first current value, and when the current flowing through the parallel cell is a second current value; and a calculator that is configured to:

calculate a direct-current internal resistance value of each of the parallel cell blocks on the basis of a differential current between the first current value and the second current value, the voltages of the parallel cell blocks at the first current value, and the voltages of the parallel cell blocks at the second current value, and perform anomaly determination for the parallel cell blocks on the basis of direct-current internal resistance values of the parallel cell blocks and a maximum value of the direct-current internal resistance values of the parallel cell blocks, the anomaly determination including calculating a ratio of the maximum value to an average value of direct-current internal resistance values of each of the parallel cell blocks and determining that the parallel cell block is non-normal when the ratio exceeds a preset value, calculating a standard deviation of all of the direct-current internal resistance values, and determining, based on the standard deviation, that there is an anomaly in the parallel cell block when the maximum value is an outlier relative to the rest of the direct-current internal resistance values, wherein the current controller is configured to stop charging and discharging to and from the storage battery module when the calculator determines the anomaly in the battery cells.

2. The cell monitoring unit according to claim 1, wherein the calculator is configured to calculate an average value of all of the direct-current internal resistance values excluding the maximum value, and the calculator is configured to calculate a ratio of the maximum value to the average value of all the direct-current internal resistance values excluding the maximum value, and is configured to determine that there is an anomaly in the parallel cell block when the ratio exceeds a preset value.

3. A cell monitoring unit that is configured to monitor a state of a storage battery module including a plurality of parallel cell blocks connected in series, the parallel cell blocks each including a plurality of battery cells connected in parallel, the cell monitoring unit, comprising:

a current detector that is configured to detect current flowing through the parallel cell blocks;

a current controller including a mechanical switch or a semiconductor switch;

a voltage detector that is configured to detect voltage of each of the parallel cell blocks when the current flowing through the parallel cell blocks is a first current value, and when the current flowing through the parallel cell is a second current value; and a calculator that is configured to:

calculate a direct-current internal resistance value of each of the parallel cell blocks on the basis of a differential current between the first current value and the second current value, the voltages of the parallel cell blocks at the first current value, and the voltages of the parallel cell blocks at the second current value, and perform anomaly determination for the parallel cell blocks on the basis of direct-current internal resistance values of the parallel cell blocks and a maximum value of the direct-current internal resistance values of the parallel cell blocks, the anomaly determination including calculating a ratio of the maximum value to an average value of direct-current internal resistance values of each of the parallel cell blocks and determining that the parallel cell block is non-normal when the ratio exceeds a preset value, calculating a standard deviation of all of the direct-current internal resistance values excluding the maximum value, and determining, based on the standard deviation, that there is an anomaly in the parallel cell block, when the maximum value is an outlier relative to the rest of the direct-current internal resistance values excluding the maximum value, wherein the current controller is configured to stop charging and discharging to and from the storage battery module when the calculator determines the anomaly in the battery cells.

4. The cell monitoring unit according to claim 1, wherein the calculator is configured to correct the direct-current internal resistance values of the parallel cell blocks according to a value of the voltage detected by the voltage detector and a temperature detected by a temperature detector that is configured to detect temperature of each of the parallel cell blocks, and the calculator is configured to perform anomaly determination for the parallel cell block according to the corrected direct-current internal resistance values.

5. The cell monitoring unit according to claim 1, wherein the calculator is configured to calculate state of charge of the parallel cell blocks by integrating the current flowing through the parallel cell blocks detected by the current detector, and is configured to correct the direct-current internal resistance values of the parallel cell blocks according to the calculated state of charge, and the calculator is configured to perform anomaly determination for the parallel cell blocks from the corrected direct-current internal resistance values.

6. The cell monitoring unit according to claim 1, wherein the calculator is configured to calculate a remaining amount of the battery cells from charge and discharge currents flowing through the parallel cell blocks detected by the current detector, and is configured to correct the direct-current internal resistance values of the parallel cell blocks according to the calculated remaining amount, and the calculator is configured to perform an anomaly determination for the parallel cell blocks according to the corrected direct-current internal resistance values.

7. The cell monitoring unit according to claim 1, further comprising:

a temperature detector that is configured to detect temperature of each of the parallel cell blocks, wherein the calculator is configured to correct the direct-current internal resistance values of the parallel cell blocks according to the temperatures detected by the temperature detector, and the calculator is configured to perform anomaly determination for the parallel cell blocks according to the corrected direct-current internal resistance values.

8. The cell monitoring unit according to claim 3, wherein the calculator is configured to calculate an average value of all of the direct-current internal resistance values excluding the maximum value, and the calculator is configured to calculate a ratio of the maximum value to the average value of all the direct-current internal resistance values excluding the maximum value, and is configured to determine that there is an anomaly in the parallel cell block when the ratio exceeds a preset value.

9. The cell monitoring unit according to claim 3, wherein the calculator is configured to correct the direct-current internal resistance values of the parallel cell blocks according to a value of the voltage detected by the voltage detector and a temperature detected by a temperature detector that is configured to detect temperature of each of the parallel cell blocks, and the calculator is configured to perform anomaly determination for the parallel cell block according to the corrected direct-current internal resistance values.

10. The cell monitoring unit according to claim 2, wherein the calculator is configured to calculate state of charge of the parallel cell blocks by integrating the current flowing through the parallel cell blocks detected by the current detector, and is configured to correct the direct-current internal resistance values of the parallel cell blocks according to the calculated state of charge, and the calculator is configured to perform anomaly determination for the parallel cell blocks from the corrected direct-current internal resistance values.

11. The cell monitoring unit according to claim 2, wherein the calculator is configured to calculate a remaining amount of the battery cells from charge and discharge currents flowing through the parallel cell blocks detected by the current detector, and is configured to correct the direct-current internal resistance values of the parallel cell blocks according to the calculated remaining amount, and the calculator is configured to perform an anomaly determination for the parallel cell blocks according to the corrected direct-current internal resistance values.

12. The cell monitoring unit according to claim 3, further comprising:

a temperature detector that is configured to detect temperature of each of the parallel cell blocks, wherein the calculator is configured to correct the direct-current internal resistance values of the parallel cell blocks according to the temperatures detected by the temperature detector, and the calculator is configured to perform anomaly determination for the parallel cell blocks according to the corrected direct-current internal resistance values.

* * * * *